(12) United States Patent
Zang et al.

(10) Patent No.: US 7,998,727 B2
(45) Date of Patent: Aug. 16, 2011

(54) DNA-BASED ELECTRONIC DIODES AND THEIR APPLICATIONS

(75) Inventors: De Yu Zang, Irvine, CA (US); James G. Grote, Yellow Springs, OH (US)

(73) Assignees: IPITEK, Inc., Carlsbad, CA (US); United States of America, as represented by the Secretary of the Air Force, Washington, DC (US)

(*) Notice: Subject to any disclaimer, the term of this patent is extended or adjusted under 35 U.S.C. 154(b) by 532 days.

(21) Appl. No.: 12/118,817

(22) Filed: May 12, 2008

(65) Prior Publication Data

US 2009/0152536 A1 Jun. 18, 2009

Related U.S. Application Data

(60) Provisional application No. 60/917,358, filed on May 11, 2007.

(51) Int. Cl.
*C12M 1/36* (2006.01)
*C07H 21/04* (2006.01)
*H01L 21/22* (2006.01)
*C04B 35/00* (2006.01)

(52) U.S. Cl. .......... 435/287.2; 536/23.1; 438/542; 252/62.3

(58) Field of Classification Search ............... None
See application file for complete search history.

(56) References Cited

U.S. PATENT DOCUMENTS 6,468,785 B1 * 10/2002 Wang et al. ............ 435/287.2
6,664,103 B2 * 12/2003 Connolly ............... 435/287.2

OTHER PUBLICATIONS

De Yu Zang, James Grote, Photoelectrical Effect and Current-Voltage Characteristics in DNA-Metal Schottky Barriers, Proc of SPIE, vol. 6470, Feb. 8, 2007.
A. Yu. Kasumov, M. Kociak, S. Gueron, B. Reulet, V.T. Volkov, D.V. Klinov, H. Bouchiat, Proximity-Induced Superconductivity in DNA, Science, vol. 291, Jan. 12, 2001.
K.W. Hipps, It's All About Contacts, Science, vol. 294, Oct. 19, 2001.

* cited by examiner

*Primary Examiner* — Betty Forman
(74) *Attorney, Agent, or Firm* — Burns & Levinson, LLP; Jacob N. Erlich, Esq.; David W. Gomes, Esq.

(57) ABSTRACT

A semiconductor device provides a metal contact, a DNA layer, wherein the metal layer and the DNA layer are adapted to form a Schottky barrier junction there between, and a conductive contact with the DNA layer.

7 Claims, 6 Drawing Sheets

DNA-BASED ELECTRONIC DIODES AND THEIR APPLICATIONS

CROSS REFERENCE TO RELATED APPLICATIONS

This application claims the priority of U.S. Provisional Application Ser. No. 60/917,358, filed May 11, 2007 and incorporated herein by reference in its entirety.

STATEMENT OF US GOVERNMENT INTEREST

This invention is made partially with U.S. Government support from the Army Research Office under a contract No. W911NF-06-C-0014. The U.S. Government has certain rights in the invention.

FIELD OF THE INVENTION

This invention relates generally to Bio-electronics, and, more particularly, to DNA-based electronic devices, such as diodes and photodetectors.

BACKGROUND OF THE INVENTION

As the miniaturization of silicon-based electronic devices continues to approach physical, technical and economic limits, the electronics industry faces the new challenge of identifying materials that can replace silicon to overcome these limits, making much denser and ultra-miniaturized electronic devices. DNA is a promising candidate material drawing widespread interest in studies of its electrical properties, particularly as to whether it is a conductive wire, a semiconductor, an insulator, or even a superconductor. Through an improved understanding of DNA electrical properties, DNA-based electronics could form the basis for molecular scale electronics, extending well beyond the silicon-based electronics limitations.

DNA, the building block of life, has been the center of biological research and industries for five decades. Just after the famous DNA double helix structure was discovered, scientists found that DNA was semi-conductive. In the past few years, the observation of DNA's conductivity properties brought renewed attention in the search for new materials for next generation nano-technologies and microelectronics. The question surfaced as to whether DNA could be also the building block for molecular electronics and play a pivotal role in the future of modern electronics. More recently, the interests in the DNA conductivity have been greatly increased and more investigations have been carried out. However, the results are confusing and contradictory, so far showing that the DNA conductivity could be an insulator, semiconductor, conductor or a proximate-induced superconductor.

BRIEF SUMMARY OF THE INVENTION

In one embodiment, a semiconductor device, comprises a metal contact, a DNA layer, wherein the metal layer and the DNA layer are adapted to form a Schottky barrier junction there between, and a conductive contact with the DNA layer. The metal contact may include gold, aluminum, copper or chromium or other metals. The DNA layer may include salmon sperm DNA. The DNA layer may be either n- or p-type semiconductor by doping. The n- or p-type DNA semiconductor materials could form p-n junction in making new DNA-based semiconductor devices. The conductive contact may be adapted to allow light energy to pass to the DNA layer. The conductive contact may be coated with indium tin oxide.

In another embodiment, a photodiode, comprises a metal contact, a DNA layer, wherein the metal layer and the DNA layer are adapted to form a Schottky barrier junction there between, and a conductive contact with the DNA layer. The metal contact may include gold, aluminum, copper or chromium. The DNA layer may include salmon sperm DNA.

BRIEF DESCRIPTION OF THE SEVERAL VIEWS OF THE DRAWINGS

The present invention is illustratively shown and described in reference to the accompanying drawings, in which.

DETAILED DESCRIPTION OF THE INVENTION

The invention relates to native DNA-based Schottky diodes made by metal-DNA contacts. The novel Schottky diodes demonstrate excellent current-voltage characteristics with low forward threshold voltage and adequately large reverse breakdown voltage needed for a practical range in low-voltage operation. In addition, there are observed and demonstrated photoelectric effects (PE) in DNA-Gold Schottky diodes. Based on carefully controlled PE measurements, the DNA-Gold Schottky barrier height is measured in one embodiment measured as ~1.52 eV.

The invention described herein also relates to photoelectric effects under visible and near-infrared illumination and diode-type rectifying current-voltage (I-V) characteristics in DNA-metal contact devices. These devices are constructed with DNA film sandwiched between gold, and transparent conductive indium tin oxide (ITO) electrodes. Other metals such as aluminum, chromium, and copper may also be used. In the embodiments described herein, DNA is used to make Schottky diodes through carefully formed contact with metals.

Prior to continuing the detailed description of the invention, a paper co-authored by the inventor, De Yu Zang, Proceedings SPIE Vol. 6470 8 Feb. 2007 "Photoelectrical effect and current-voltage characteristics in DNA-metal Schottky barriers", is incorporated herein by reference.

Nonmetal-metal contact is generally not ohmic. In such a non-ohmic contact, the current response to the applied voltage is normally not linear. If the nonmetal material is a semiconductor, its contact with a metal could form a Schottky barrier if the interfaces are pure and clean. The Schottky barrier is a potential barrier arising from stable space charges in the semiconductor alone without the presence of a chemical layer.

Figure 1A:
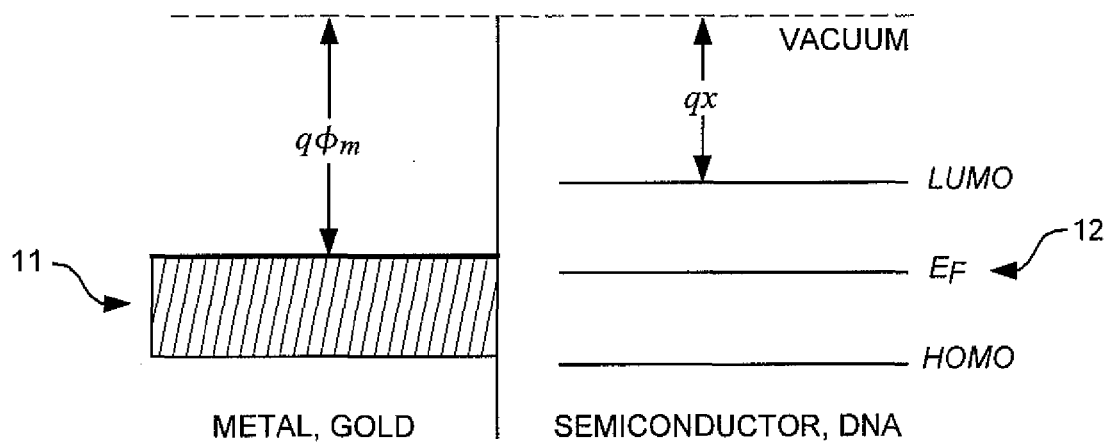
FIG. 1A is an energy band diagram of metal (gold)-semiconductor (DNA) contacts before contacting.
Figure 1B:
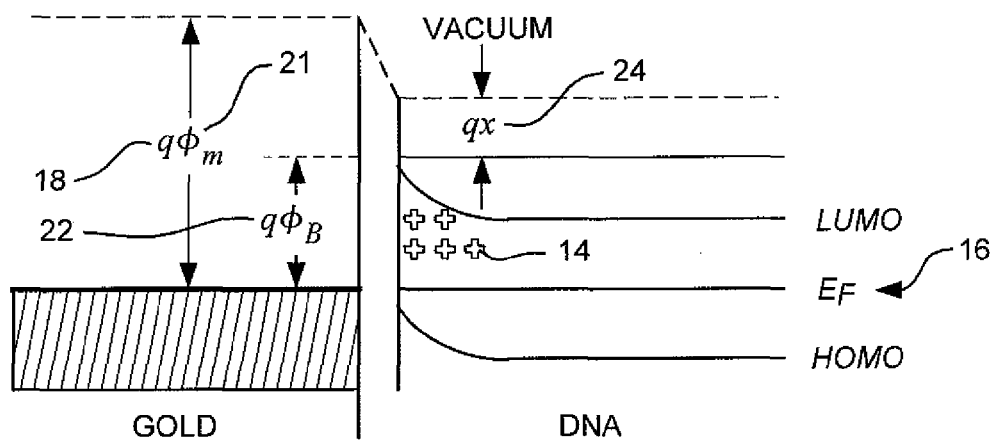
FIG. 1B is an energy band diagram of metal (gold)-semiconductor (DNA) contacts after contacting and using an n-type DNA semiconductor.

FIGS. 1A and 1B are the schematic diagrams of energy bands 11, 12 in a metal (gold) and an n-type semiconductor, respectively, at conditions before and after contacting. Before contacting (FIG. 1A), the system is not at thermal equilibrium. After contacting (FIG. 1B), the charges 14 will flow from semiconductor to the metal and the electronic equilibrium is established Fermi levels 16 on both sides line up. Here, LUMO (lowest unoccupied molecular orbital), EF (Fermi level) and HOMO (highest occupied molecular orbital) are the conduction, Fermi and valence energy levels, respectively; q 18 is the electron charge; Φm 21 is the gold work function, which is ~5.1 eV for gold and ΦB 22 is the Schottky barrier height, q 24 is the electron affinity measured from conduction band to the vacuum level.

Figure 2A:
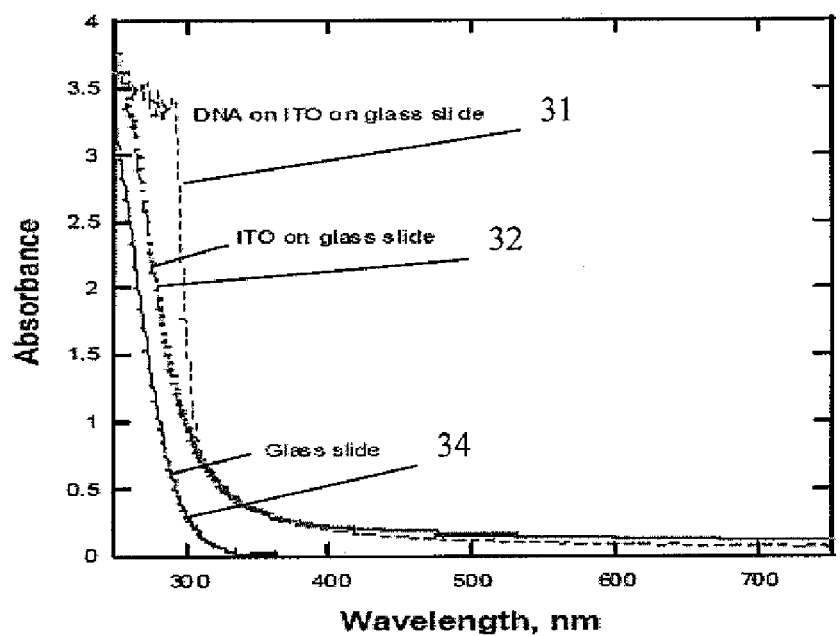
FIG. 2A is a pictorial of the absorption spectrum measurements of DNA+ITO+glass and ITO+glass.
Figure 2B:
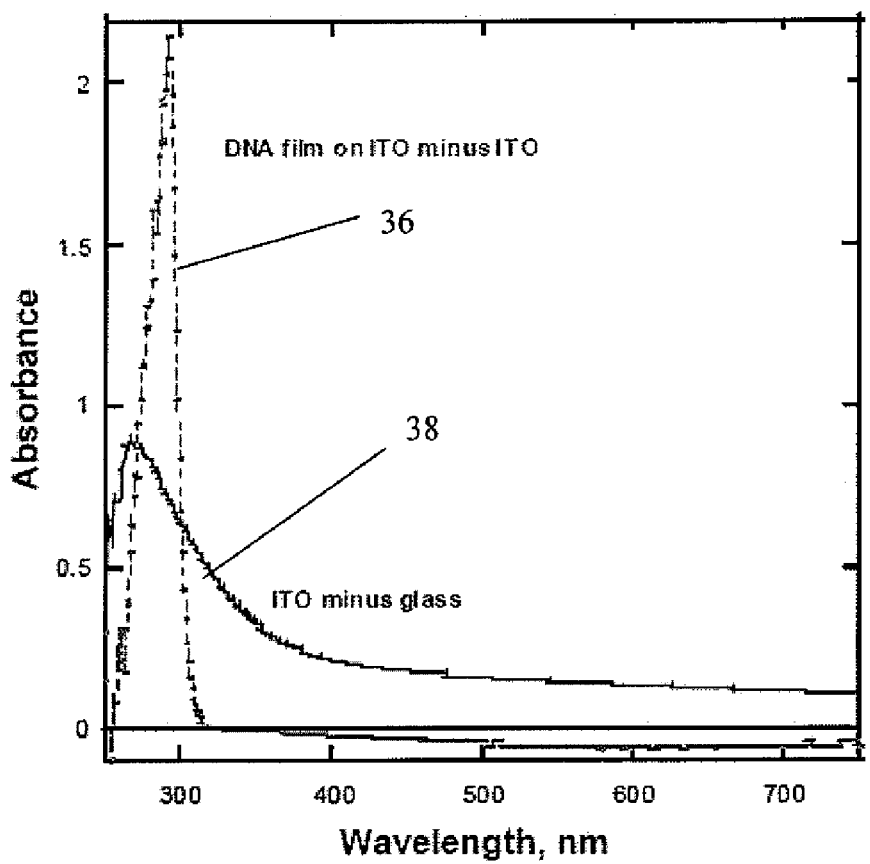
FIG. 2B is a pictorial of the absorption spectrum measurements of DNA and ITO.

FIGS. 2A and 2B show the absorption spectrum measurements of DNA and ITO. In FIG. 2A, the dashed, the solid lines are the absorption spectra 31 of DNA film on an ITO-coated glass slide; 32 ITO-glass slide and 34 glass slide, respectively. In FIG. 2B, the dashed and solid lines are the absorption spectra of DNA (extracted) 36 and ITO (extracted) 38, respectively. All the measurements show that DNA and ITO have absorption peaks at <300 nm, which are in the ultraviolet wavelength range and their bandgaps must be greater than 4 eV. These indicate that visible (or infrared) light cannot release an electron in the DNA or ITO areas (no photocurrent under visible and near infrared illumination) since the photons at these wavelengths do not have enough energy.

Figure 3A:
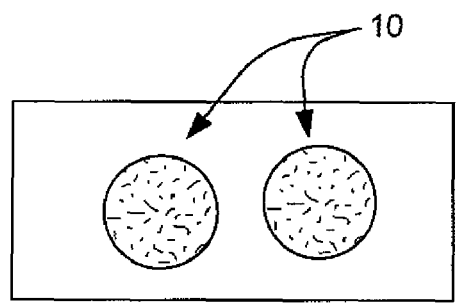
FIG. 3A is a DNA-metal Schottky diode schematic diagram.
Figure 3B:
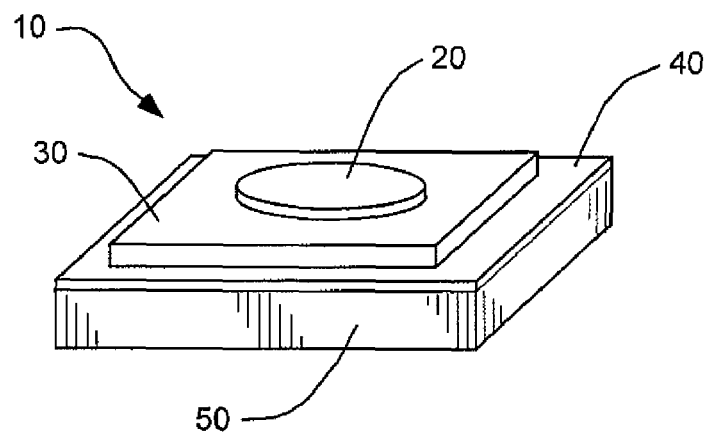
FIG. 3B is an unwired DNA-metal Schottky diode device.
Figure 3C:
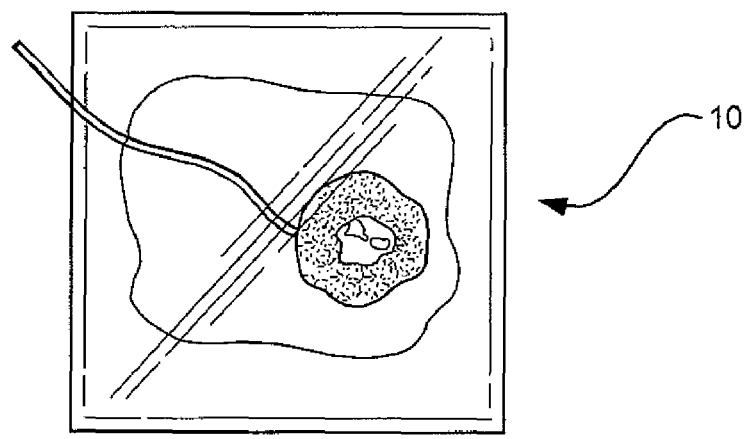
FIG. 3C is an unwired DNA-metal Schottky diode device.

The DNA-metal device 10 of FIGS. 3A, 3B, and 3C includes three layers: top, gold layer electrode 20; a bottom electrode 50 coated with ITO 40; and a thin DNA film 30, which is sandwiched between the two electrodes 20, 50. In a preferred embodiment, the thickness of the gold electrode 20 is ~1000 Å, and the thickness of the ITO coated electrode is ~700 Å. The thickness of DNA film 30 is 13-19 μm. The DNA film 30 is generally shining and smooth with a uniformity of 10% typically in the device working area. The DNA/metal electrode 20 area, which defines the device working area, is ~0.691 cm$^2$.

Any suitable DNA may be used. In the preferred embodiment a) Salmon sperm-based DNA with a molecule weight of 8-10 kbps having a purity is 94-95%; b) De-ionic water with resistance greater than 18 MΩ and pH value of ~8.0, and c) gold with purity greater than 99.99%. Chromium, aluminum and copper may alternatively be used, provided that the purity is also greater than 99.99%.

In fabrication, the DNA is completely dissolved into de-ionized water with a weight ratio of 1:100. The DNA-water solution is filtered with a 1.2 μm filter and then is cast on a 1"×1" ITO-coated glass substrate. The sample is immediately placed into an oven to dry. As soon as the DNA film is dried completely, the sample is transported into a sputtering machine to deposit a patterned thin gold layer on the DNA film 30 as the top electrode 20. Finally, the top and bottom electrodes are connected with electric wires.

To improve the sensitivity of photoelectrical effect, the device is mostly treated under an "electric poling process" in an attempt to align DNA molecules along the electric field and create DNA permanent dipoles. The method of the electric poling is as follows. The device is placed in a nitrogen environment and an electric field is applied. The device is heated and allowed to cool down to room temperature. The electric field strength is monitored by measuring the electric current through the device. After electric poling, the device is stored at room temperature for at least one week for discharging before any measurements.

The metal sputtering processing in the fabrication is important to form the DNA-metal Schottky barriers. During the sputtering deposition, the metal ions in the plasma beams bombard the soft DNA surface and eventually clean it of any contamination accumulated in prior preparations. The thin metal layer is then intimately contacted with the clean DNA surface forming a Schottky barrier.

Figure 4:
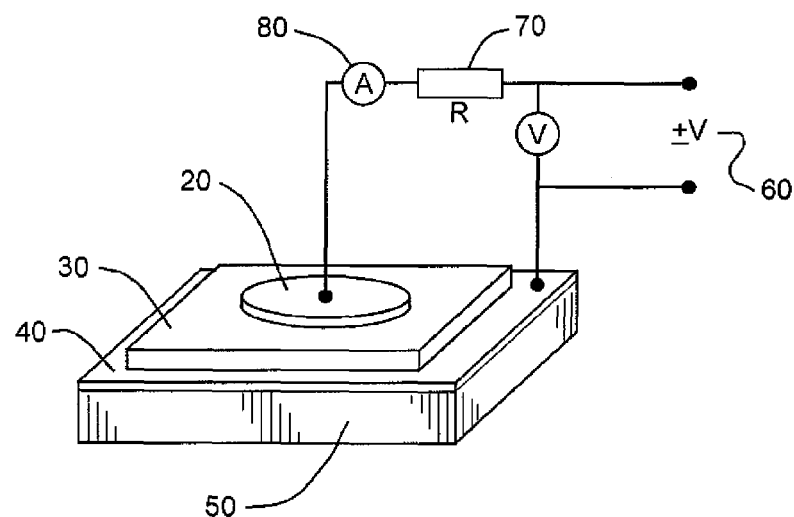
FIG. 4 is DNA-metal Schottky diode current-voltage measurement setup.

FIG. 4 shows a circuit schematic to measure the current-voltage behavior of device 10. A voltage V 60 is applied between the ITO coated electrode 40 and the gold electrode 20, with resistor 70 and ammeter 80 connected in series.

As a voltage 60 is applied on ITO electrode 40 and the gold electrode 20, a current is generated in the circuit. If the voltage 60 is plus on the ITO electrode 40, which is commonly called a forward bias, the current is increased exponentially as the voltage 60 is increased beyond a certain value (threshold voltage). However, if the voltage 60 applied on the ITO electrode 40 is negative, which is commonly called reverse bias, the current is quite limited as the voltage is increased (not exceed to a certain value, the so-called breakdown voltage).

The reason for such rectifying I-V characteristics is that the forward bias reduces the Schottky barrier allowing the electrons to more easily to overcome the barrier, whereas the reverse bias increases the barrier making the electron flow more difficult.

Figure 5:
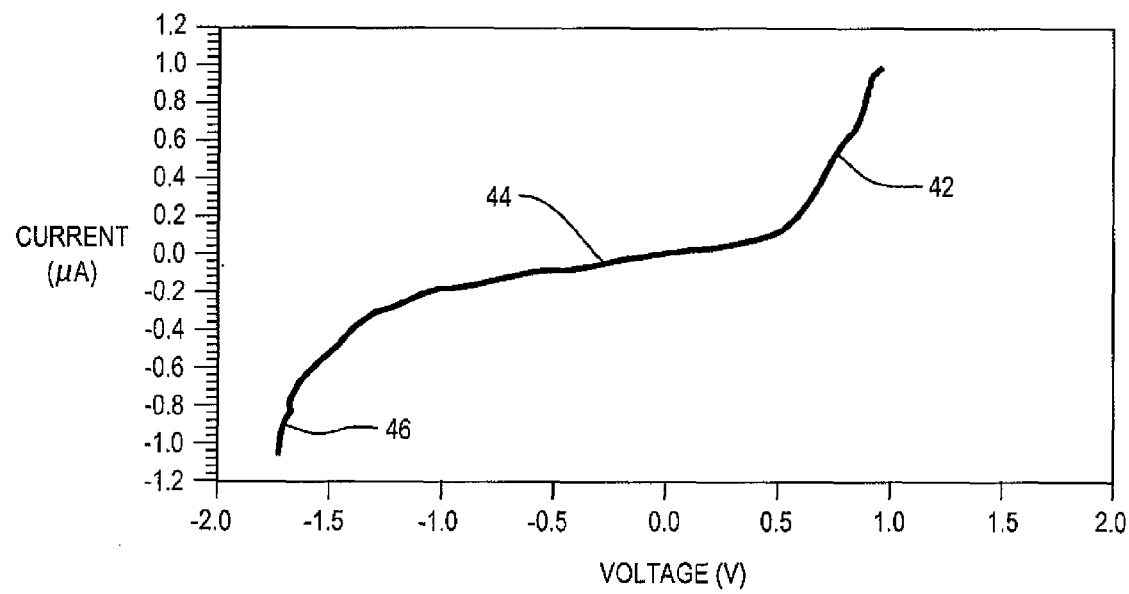
FIG. 5 is a current-voltage characteristics graph of chromium-DNA based Schottky diode.

FIG. 5 is an example I-V measurement data showing typical rectifying I-V characteristics. Under a forward bias 42, the current increases exponentially, while at reverse bias 44, the current is quite limited when the reverse voltage is smaller than the breakdown voltage. The reverse current is increased exponentially when the reverse bias exceeds the breakdown voltage 46.

The DNA Schottky diodes showed excellent current-voltage characteristics with low forward threshold voltage and sufficiently large reverse breakdown voltage essential to allow useful and wide-ranging applications.

Figure 6A:
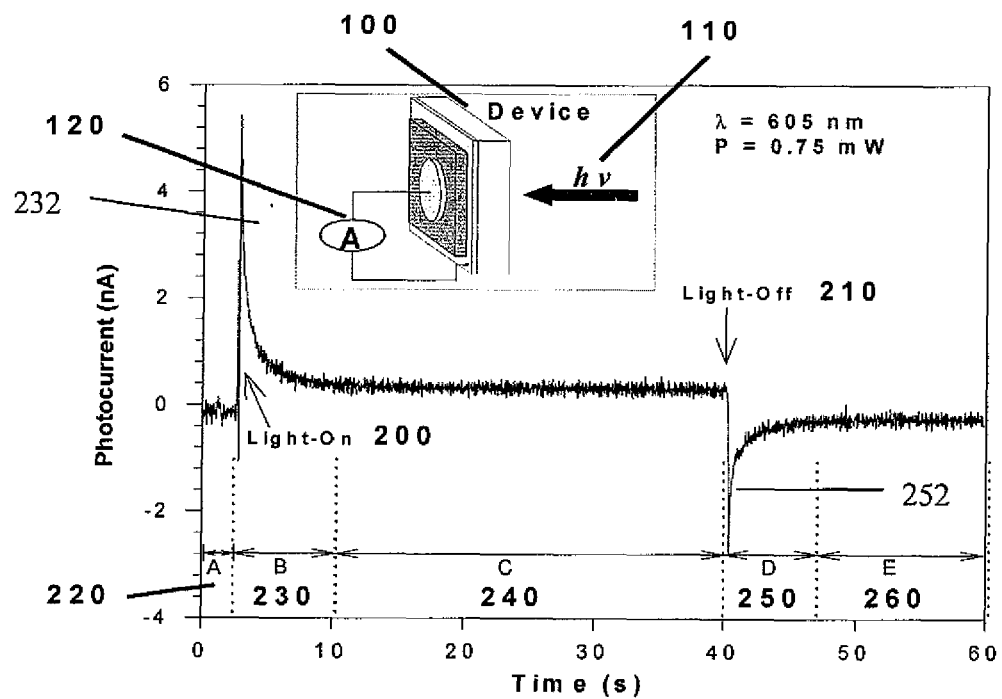
FIG. 6A is a time versus photocurrent graph illustrating the Measurement Setup (Inlet) and Typical Photocurrent Response of an Au-DNA device.

FIG. 6A shows the schematic for photoelectric effect tests on a DNA-metal device 100, illuminated by light of photon energy hν 110, producing photo-induced current A 120. The device is not biased. The analog current 120 value connected to a computer for sampling and real time recordings. The sampling rate is 100 Hz. The light source can be monochromic such as a laser with proper wavelength, or a lamp with a high-pass optical filter. Launching a light beam on ITO-DNA side to pass through the glass substrate, ITO-DNA interface and DNA layer to reach gold layer, electrons could be excited. The excited electrons in the gold layer can be either: a) across over the barrier height into the conduction band in the DNA to generate current if the light energy hν>q ΦB, or b) remain in the gold layer (release energy to heat) if the light energy hν<q ΦB.

Transient current spikes at 232 and 252 occur when input light 110 is switched on 200 and then later switched off 210. The current characteristics are described in the five time spans shown 220, 230, 240, 250, and 260, which are: Region A 220 before light on 200; Region B 230 immediately after light-on 200; Region C 240 is during continued illumination; Region D 250 immediately after Light-Off 210; and Region E 260 beyond signal relaxation after Light-Off 210.

Figure 6B:
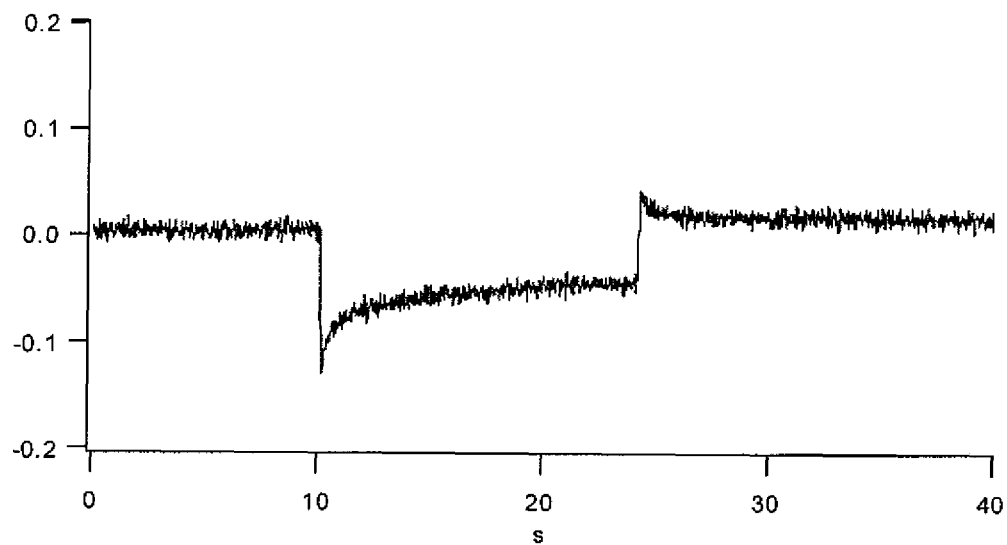
FIG. 6B is a time versus photocurrent graph illustrating Typical Photocurrent Response of an Cu-DNA device.

FIG. 6B shows a similar curve for a Cu-DNA device under the same test conditions, except that the spikes occur in the opposite direction. Compared with PE in Au-DNA devices, the PE current direction in Cu-DNA was noticeably opposite with that in Au-DNA devices, as shown in FIG. 6B. For Au-DNA devices, the photocurrent was from Au to ITO (or DNA), while the photocurrent was from ITO (or DNA) to Cu for Cu-DNA devices. To explain the opposite photoelectric current in Au-DNA and Cu-DNA devices, we suggest that electrochemical doping might take place when the devices were in the process of electric poling. The doping of Au ions into DNA induces an n-type DNA, while Cu ions cause a p-type DNA.

Figure 7:
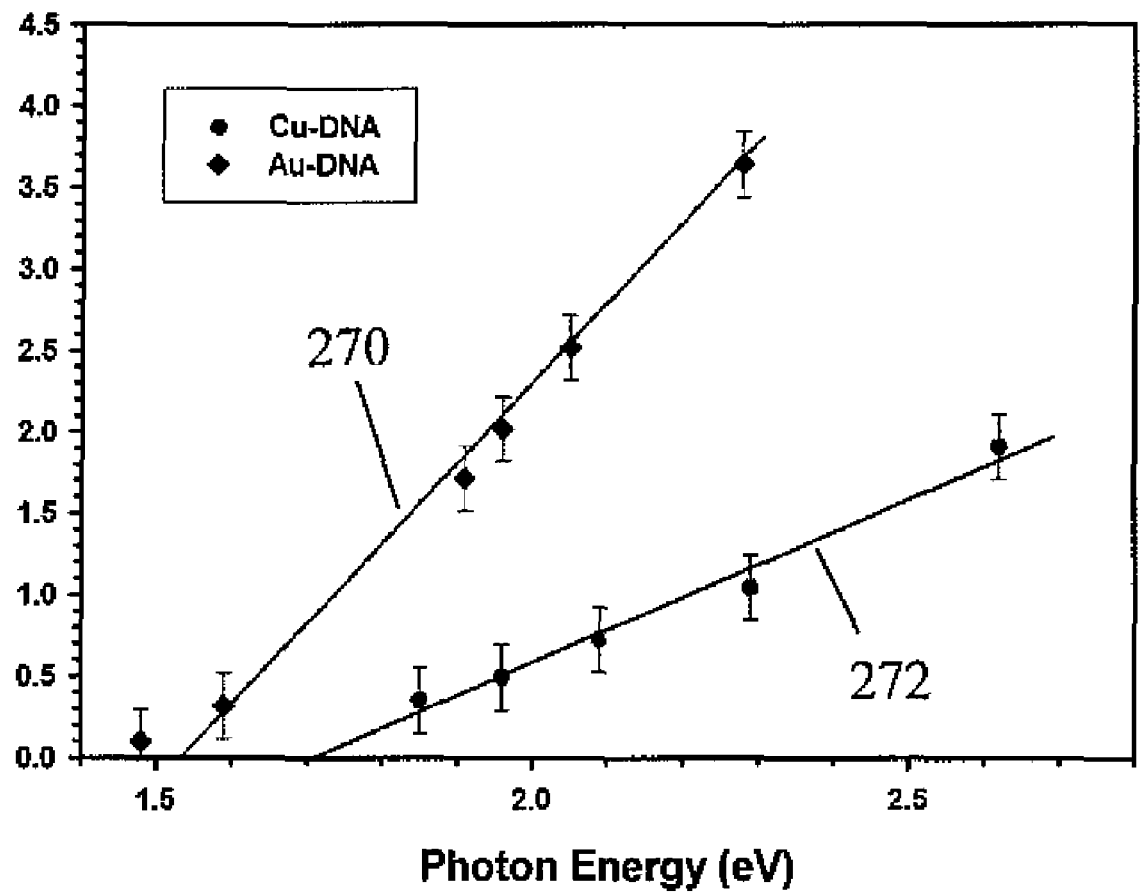
FIG. 7 depicts the Square Root of Photocurrent Vs. Incident Photon Energy in Gold-DNA Schottky Barrier.

FIG. 7 summarizes the results of a series of photoelectric effect tests using six different light sources with various values of said photon energy hv 110 performed on both a Cu-DNA device (plot 270) and a Au-DNA device (plot 272). The square root of photo-response/photon is plotted versus said photon energy 110, and the linear intercept point is where the photon energy 110 equals the Schottky barrier height of 1.7 for Cu-DNA device and 1.52 eV for the Au-DNA device.

Although the invention has been described with respect to various embodiments, it should be realized this invention is also capable of a wide variety of further and other embodiments.

What is claimed is:

1. A semiconductor device, comprising:
   a metal contact;
   a DNA layer;
   wherein the metal contact and the DNA layer are adapted to form a Schottky barrier junction there between; and
   a conductive contact with the DNA layer; and
   wherein the conductive contact is adapted to allow light energy to pass to the DNA layer.

2. The device of claim 1, wherein the metal contact includes gold, aluminum, copper or chromium.

3. The device of claim 1, wherein the DNA layer includes salmon sperm DNA.

4. The device of claim 3, wherein the DNA layer is either n- or p-type semiconductor by doping.

5. The device of claim 1, where the conductive contact is coated with indium tin oxide.

6. The device of claim 1, wherein the Schottky barrier has a barrier height of less than 2 eV.

7. The device of claim 1, wherein the metal contact, the DNA layer and the conductive contact form a photodiode.

* * * * *